(12) United States Patent
Kerr et al.

(10) Patent No.: US 10,461,729 B2
(45) Date of Patent: Oct. 29, 2019

(54) STACKED RF SWITCH WITH FAST SWITCHING SPEED

(71) Applicant: Qorvo US, Inc., Greensboro, NC (US)

(72) Inventors: Daniel Charles Kerr, Oak Ridge, NC (US); Eric K. Bolton, Kernersville, NC (US)

(73) Assignee: Qorvo US, Inc., Greensboro, NC (US)

( * ) Notice: Subject to any disclaimer, the term of this patent is extended or adjusted under 35 U.S.C. 154(b) by 51 days.

(21) Appl. No.: 15/439,851

(22) Filed: Feb. 22, 2017

(65) Prior Publication Data

US 2017/0244401 A1 Aug. 24, 2017

Related U.S. Application Data

(60) Provisional application No. 62/298,063, filed on Feb. 22, 2016.

(51) Int. Cl.
*H03K 17/04* (2006.01)
*H03K 17/041* (2006.01)
*H03K 17/693* (2006.01)

(52) U.S. Cl.
CPC ..... *H03K 17/04106* (2013.01); *H03K 17/693* (2013.01)

(58) Field of Classification Search
CPC .............. H03K 17/04106; H03K 17/693

USPC .......................................................... 327/376
See application file for complete search history.

(56) References Cited

U.S. PATENT DOCUMENTS 8,674,746 B1 * 3/2014 Staudinger ............... H03H 7/25
327/333
8,749,296 B2 6/2014 Granger-Jones

* cited by examiner

*Primary Examiner* — Metasebia T Retebo
(74) *Attorney, Agent, or Firm* — Withrow & Terranova, P.L.L.C.

(57) ABSTRACT

A first stacked RF switch, which operates in one of an ON mode and an OFF mode, and includes a group of RF switching circuits coupled in series between a first RF switch connection node and a second RF switch connection node, is disclosed. The group of RF switching circuits includes a first RF switching circuit, which includes a first switching transistor element coupled between a first source connection node and a first drain connection node, a first source/drain (S/D) bias resistive element coupled across the first switching transistor element, and a first S/D shorting circuit coupled across the first S/D bias resistive element. During the ON mode, the first switching transistor element is ON and the first S/D shorting circuit is ON. During a first interval immediately following a transition from the ON mode to the OFF mode, the first S/D shorting circuit is ON.

18 Claims, 9 Drawing Sheets

STACKED RF SWITCH WITH FAST SWITCHING SPEED

RELATED APPLICATIONS

This application claims the benefit of provisional patent application Ser. No. 62/298,063, filed Feb. 22, 2016, the disclosure of which is hereby incorporated herein by reference in its entirety.

FIELD OF THE DISCLOSURE

Embodiments of the present disclosure relate to radio frequency (RF) communications systems that include RF switches that may be coupled to other RF circuitry.

BACKGROUND

Certain RF communications systems may include stacked RF switches that require fast switching speeds and high quality (Q) factors. Stacked RF switches may typically use multiple biasing resistors to provide appropriate biasing signals to each stacked segment. Fast switching speeds may require low resistor values for proper operation. However, low resistor values may reduce Q factors below acceptable levels. As such, there is a need for a stacked RF switch that provides both a fast switching speed and a high Q factor.

SUMMARY

A first stacked RF switch, which operates in one of an ON mode and an OFF mode, and includes a group of RF switching circuits coupled in series between a first RF switch connection node and a second RF switch connection node, is disclosed according to one embodiment of the present disclosure. The group of RF switching circuits includes a first RF switching circuit, which includes a first switching transistor element coupled between a first source connection node and a first drain connection node, a first source/drain (S/D) bias resistive element coupled across the first switching transistor element, and a first S/D shorting circuit coupled across the first S/D bias resistive element. During the ON mode, the first switching transistor element is ON and the first S/D shorting circuit is ON. During a first interval immediately following a transition from the ON mode to the OFF mode, the first S/D shorting circuit is ON. In one embodiment of the first stacked RF switch, during the OFF mode, the first switching transistor element is OFF, and during the OFF mode after the first interval, the first S/D shorting circuit is OFF.

In one embodiment of the first stacked RF switch, the first RF switching circuit further includes a first gate resistive element coupled between a first gate input connection node and a gate of the first switching transistor element, a first supplemental gate resistive element coupled between a first gate output connection node and the gate of the first switching transistor element, and a first gate shorting circuit coupled between the first gate input connection node and the first gate output connection node. During the ON mode, the first switching transistor element is ON, the first S/D shorting circuit is ON, and the first gate shorting circuit is ON. During a first interval immediately following a transition from the ON mode to the OFF mode, the first S/D shorting circuit is ON; and during a second interval immediately following the transition from the ON mode to the OFF mode, the first gate shorting circuit is ON. In one embodiment of the first stacked RF switch, the second interval is equal to the first interval.

By using shorting circuits, such as the first S/D shorting circuit, the first gate shorting circuit, or both, the first stacked RF switch may have a fast switching speed while using high resistance values of the first S/D bias resistive element and the gate resistive elements, such that the first stacked RF switch has both a fast switching speed and a high Q factor. In an alternate embodiment of the first stacked RF switch, any one or more of the first S/D shorting circuit, the first S/D bias resistive element, and the first gate shorting circuit are omitted.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A first stacked RF switch, which operates in one of an ON mode and an OFF mode, and includes a group of RF switching circuits coupled in series between a first RF switch connection node and a second RF switch connection node, is disclosed according to one embodiment of the present disclosure. The group of RF switching circuits includes a first RF switching circuit, which includes a first switching transistor element coupled between a first source connection node and a first drain connection node, a first source/drain (S/D) bias resistive element coupled across the first switching transistor element, and a first S/D shorting circuit coupled across the first S/D bias resistive element. During the ON mode, the first switching transistor element is ON and the first S/D shorting circuit is ON. During a first interval immediately following a transition from the ON mode to the OFF mode, the first S/D shorting circuit is ON. In one embodiment of the first stacked RF switch, during the OFF mode, the first switching transistor element is OFF, and during the OFF mode after the first interval, the first S/D shorting circuit is OFF.

In one embodiment of the first stacked RF switch, the first RF switching circuit further includes a first gate resistive element coupled between a first gate input connection node and a gate of the first switching transistor element, a first supplemental gate resistive element coupled between a first gate output connection node and the gate of the first switching transistor element, and a first gate shorting circuit coupled between the first gate input connection node and the first gate output connection node. During the ON mode, the first switching transistor element is ON, the first S/D shorting circuit is ON, and the first gate shorting circuit is ON. During a first interval immediately following a transition from the ON mode to the OFF mode, the first S/D shorting circuit is ON; and during a second interval immediately following the transition from the ON mode to the OFF mode, the first gate shorting circuit is ON. In one embodiment of the first stacked RF switch, the second interval is equal to the first interval.

By using shorting circuits, such as the first S/D shorting circuit, the first gate shorting circuit, or both, the first stacked RF switch may have a fast switching speed while using high resistance values of the first S/D bias resistive element and the gate resistive elements, such that the first stacked RF switch has both a fast switching speed and a high Q factor. In an alternate embodiment of the first stacked RF switch, any one or more of the first S/D shorting circuit, the first S/D bias resistive element, and the first gate shorting circuit are omitted.

Figure 1:
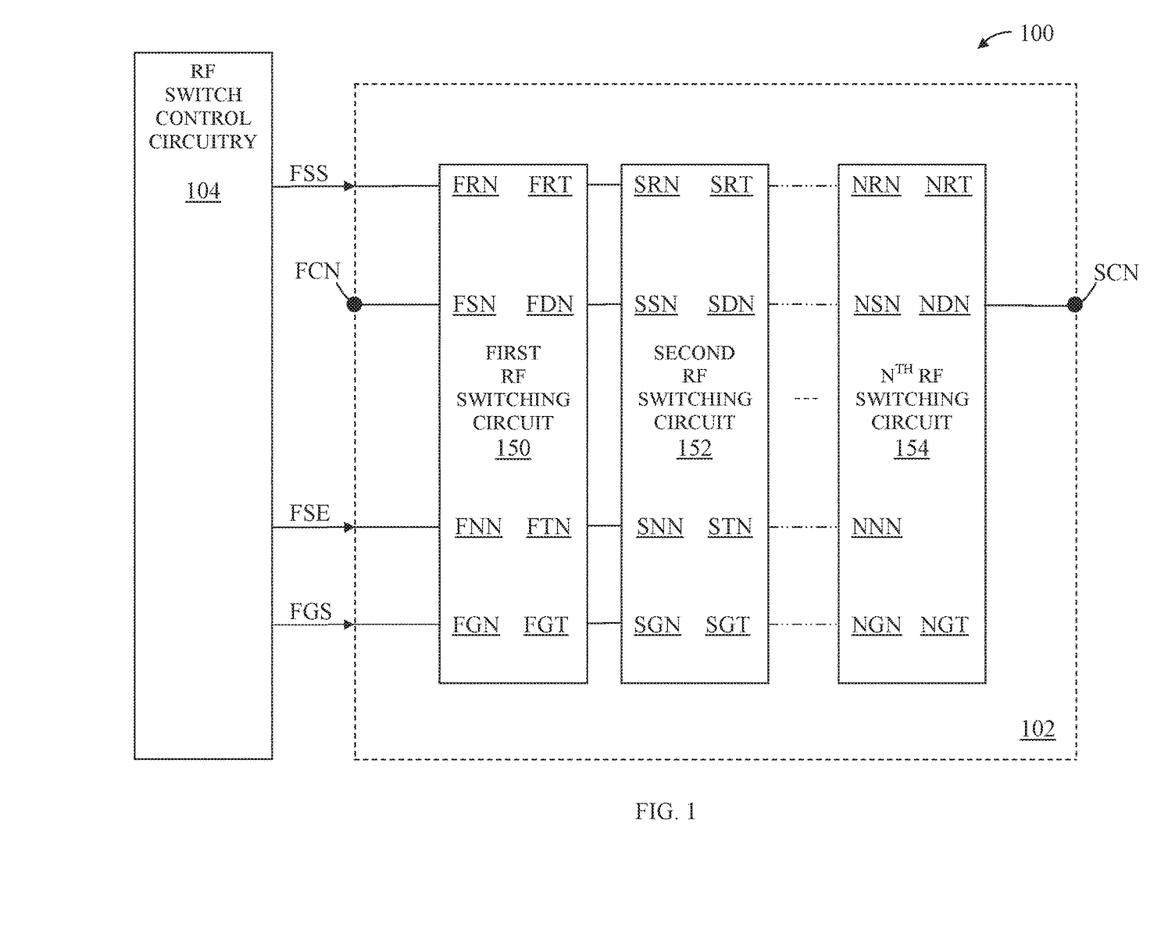
FIG. 1 shows RF circuitry according to one embodiment of the RF circuitry.

FIG. 1 shows RF circuitry 100 according to one embodiment of the RF circuitry 100. The RF circuitry 100 includes a first stacked RF switch 102 and RF switch control circuitry 104. The first stacked RF switch 102 has a first RF switch connection node FCN and a second RF switch connection node SCN. Additionally, the first stacked RF switch 102 includes a first RF switching circuit 150, a second RF switching circuit 152, and up to and including an $N^{TH}$ RF switching circuit 154 coupled in series between the first RF switch connection node FCN and the second RF switch connection node SCN. In general, the first stacked RF switch 102 includes a group of RF switching circuits 150, 152, 154 coupled in series between the first RF switch connection node FCN and the second RF switch connection node SCN. In an alternate embodiment of the first stacked RF switch 102, any one or more of the group of RF switching circuits 150, 152, 154 are omitted. In one embodiment of the RF circuitry 100, each of any or all of the group of RF switching circuits 150, 152, 154 are similar to the first RF switching circuit 150. In one embodiment of the first stacked RF switch 102, the first stacked RF switch 102 is based on a silicon-on-insulator (SOI) complementary metal-oxide-semiconductor (CMOS) manufacturing process.

The first RF switching circuit 150 has a first source connection node FSN, a first drain connection node FDN, a first gate input connection node FNN, a first gate output connection node FTN, a first S/D input shorting connection node FRN, a first S/D output shorting connection node FRT, a first gate input shorting connection node FGN, and a first gate output shorting connection node FGT. The second RF switching circuit 152 has a second source connection node SSN, a second drain connection node SDN, a second gate input connection node SNN, a second gate output connection node STN, a second S/D input shorting connection node SRN, a second S/D output shorting connection node SRT, a second gate input shorting connection node SGN, and a second gate output shorting connection node SGT. The $N^{TH}$ RF switching circuit 154 has an $N^{TH}$ source connection node NSN, an $N^{TH}$ drain connection node NDN, an $N^{TH}$ gate input connection node NNN, an $N^{TH}$ S/D input shorting connection node NRN, and an $N^{TH}$ S/D output shorting connection node NRT an $N^{TH}$ gate input shorting connection node NGN, and an $N^{TH}$ gate output shorting connection node NGT.

In one embodiment of the RF circuitry 100, the first S/D output shorting connection node FRT is coupled to the second S/D input shorting connection node SRN. In one embodiment of the RF circuitry 100, the first S/D output shorting connection node FRT is directly coupled to the second S/D input shorting connection node SRN. In one embodiment of the RF circuitry 100, the second S/D output shorting connection node SRT is coupled to the $N^{TH}$ S/D input shorting connection node NRN. In one embodiment of the RF circuitry 100, the second S/D output shorting connection node SRT is directly coupled to the $N^{TH}$ S/D input shorting connection node NRN. In one embodiment of the RF circuitry 100, the second S/D output shorting connection node SRT is coupled to the $N^{TH}$ S/D input shorting connection node NRN via intervening circuitry (not shown).

In one embodiment of the RF circuitry 100, the first gate output shorting connection node FGT is coupled to the second gate input shorting connection node SGN. In one embodiment of the RF circuitry 100, the first gate output shorting connection node FGT is directly coupled to the second gate input shorting connection node SGN. In one embodiment of the RF circuitry 100, the second gate output shorting connection node SGT is coupled to the $N^{TH}$ gate input shorting connection node NGN. In one embodiment of the RF circuitry 100, the second gate output shorting connection node SGT is directly coupled to the $N^{TH}$ gate input shorting connection node NGN. In one embodiment of the RF circuitry 100, the second gate output shorting connection node SGT is coupled to the $N^{TH}$ gate input shorting connection node NGN via intervening circuitry (not shown).

The first RF switch connection node FCN is coupled to the first source connection node FSN. In one embodiment of the first stacked RF switch 102, the first RF switch connection node FCN is directly coupled to the first source connection node FSN. The first drain connection node FDN is coupled to the second source connection node SSN. In one embodiment of the first stacked RF switch 102, the first drain connection node FDN is directly coupled to the second source connection node SSN. The second drain connection node SDN is coupled to the $N^{TH}$ source connection node NSN via any additional RF switching circuits (not shown). In one embodiment of the first stacked RF switch 102, the second drain connection node SDN is directly coupled to the $N^{TH}$ source connection node NSN. In one embodiment of the first stacked RF switch 102, the second RF switching circuit 152 is omitted. The second RF switch connection node SCN is coupled to the $N^{TH}$ drain connection node NDN. In one embodiment of the first stacked RF switch 102, the second RF switch connection node SCN is directly coupled to the $N^{TH}$ drain connection node NDN.

In one embodiment of the first stacked RF switch 102, the first stacked RF switch 102 operates in one of an ON mode and an OFF mode. In one embodiment of the RF switch control circuitry 104, the RF switch control circuitry 104 selects the one of the ON mode and the OFF mode, and provides a first RF switch enable signal FSE to the first RF switching circuit 150 via the first gate input connection node FNN, such that the first RF switch enable signal FSE is representative of the one of the ON mode and the OFF mode.

During a transition from the OFF mode to the ON mode, a first switching transistor element 200 (FIG. 3) transitions from OFF to ON and a first S/D shorting circuit 204 (FIG. 3) transitions from OFF to ON. During the ON mode, the first switching transistor element 200 (FIG. 3) is ON based on the first RF switch enable signal FSE and the first S/D shorting circuit 204 (FIG. 3) is ON based on a first S/D shorting enable signal FSS. During a first interval immediately following a transition from the ON mode to the OFF mode, the first S/D shorting circuit 204 (FIG. 3) is ON based on the first S/D shorting enable signal FSS.

In one embodiment of the first stacked RF switch 102, during the OFF mode, the first switching transistor element 200 (FIG. 3) is OFF based on the first RF switch enable signal FSE, and during the OFF mode after the first interval, the first S/D shorting circuit 204 (FIG. 3) is OFF based on the first S/D shorting enable signal FSS.

In general, the group of RF switching circuits 150, 152, 154 includes a corresponding group of gate input shorting connection nodes FGN, SGN, NGN and a group of S/D input shorting connection nodes FRN, SRN, NRN and a corresponding group of S/D output shorting connection nodes FRT, SRT, NRT, such that the group of The RF switch control circuitry 104 provides the first S/D shorting enable signal FSS to each of the group of RF switching circuits 150, 152, 154 via the corresponding group of S/D shorting connection nodes FRN, SRN, NRN. Further, the RF switch control circuitry 104 provides a first gate shorting enable signal FGS to each of the group of RF switching circuits 150, 152, 154 via the corresponding group of gate shorting connection nodes FGN, SGN, NGN. In one embodiment of the RF switch control circuitry 104, the RF switch control circuitry 104 provides the first S/D shorting enable signal FSS to the first S/D shorting circuit 204 (FIG. 3) via the first S/D shorting connection node FRN based on the selected one of the ON mode and the OFF mode.

In an alternate embodiment of the RF circuitry 100, S/D shorting is omitted, such that the first S/D shorting enable signal FSS and the group of S/D shorting connection nodes FRN, SRN, NRN are omitted. In addition, in another embodiment of the RF circuitry 100, gate shorting is omitted, such that the first gate shorting enable signal FGS and the gate shorting connection nodes FGN, SGN, NGN are omitted. In one embodiment of the first stacked RF switch 102, the group of RF switching circuits 150, 152, 154 is directly coupled between the first RF switch connection node FCN and the second RF switch connection node SCN.

Figure 2:
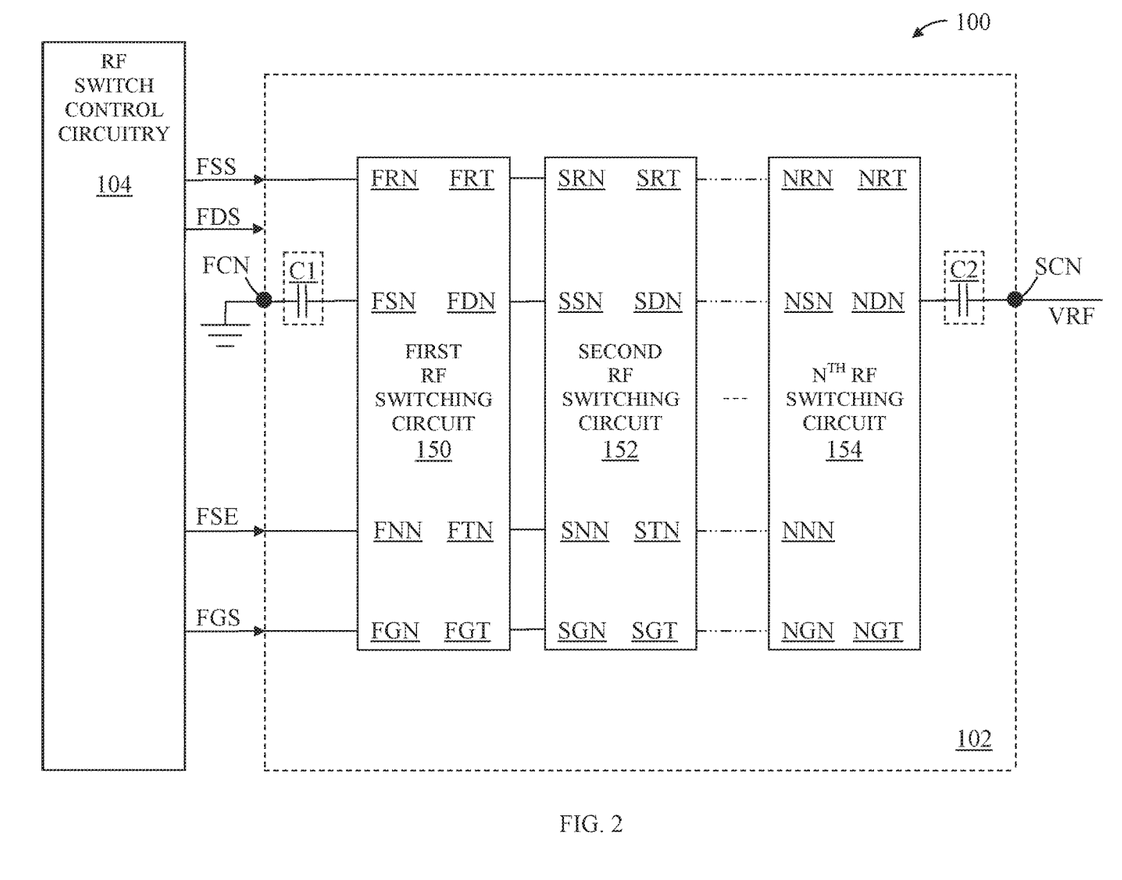
FIG. 2 shows the RF circuitry according to an alternate embodiment of the RF circuitry.

FIG. 2 shows the RF circuitry 100 according to an alternate embodiment of the RF circuitry 100. The RF circuitry 100 illustrated in FIG. 2 is similar to the RF circuitry 100 illustrated in FIG. 1, except in the RF circuitry 100 illustrated in FIG. 2, the first stacked RF switch 102 further includes a first capacitive element C1 and a second capacitive element C2. The first capacitive element C1 is coupled between the first RF switch connection node FCN and the first source connection node FSN, such that the first capacitive element C1 is coupled between the first RF switching circuit 150 and the first RF switch connection node FCN. The second capacitive element C2 is coupled between the second RF switch connection node SCN and the $N^{TH}$ drain connection node NDN, such that the second capacitive element C2 is coupled between the $N^{TH}$ RF switching circuit 154 and the second RF switch connection node SCN.

In general, the first capacitive element C1 is coupled between the group of RF switching circuits 150, 152, 154 and the first RF switch connection node FCN, and the second capacitive element C2 is coupled between the group of RF switching circuits 150, 152, 154 and the second RF switch connection node SCN.

In one embodiment of the RF circuitry 100, the first RF switch connection node FCN is coupled to ground. In one embodiment of the RF circuitry 100, the first RF switch connection node FCN is directly coupled to ground. In one embodiment of the RF circuitry 100, the second RF switch connection node SCN is coupled to other circuitry (not shown), which may provide an RF voltage VRF to the second RF switch connection node SCN during the OFF mode.

In one embodiment of the RF circuitry 100, the RF switch control circuitry 104 provides a first DC bias signal FDS to the first stacked RF switch 102. The first DC bias signal FDS provides a DC bias voltage across the first capacitive element C1, such that during the ON mode, a voltage of the first RF switch enable signal FSE is positive with respect to a voltage of the first DC bias signal FDS, and during the OFF mode, the voltage of the first RF switch enable signal FSE is negative with respect to the voltage of the first DC bias signal FDS.

Figure 3:
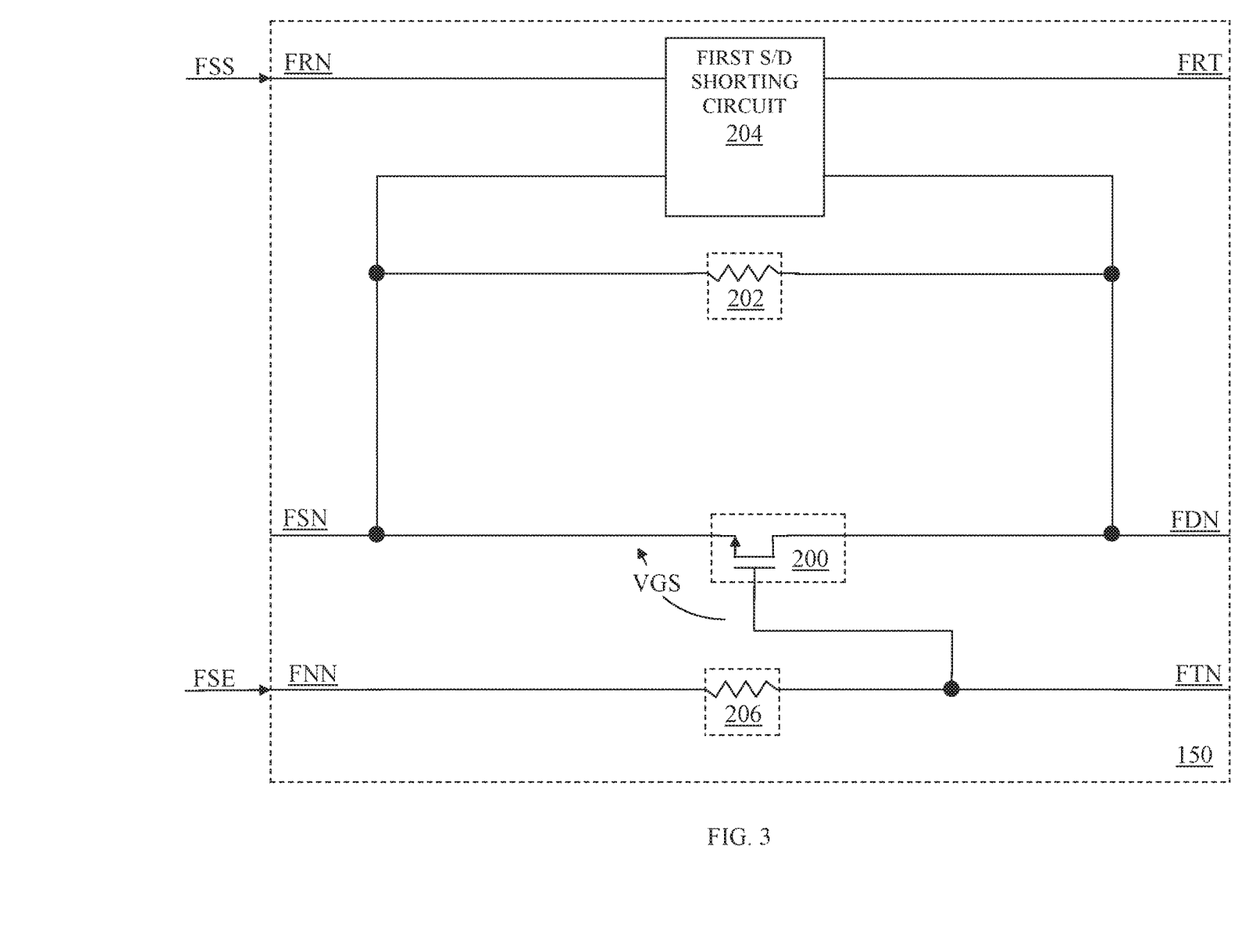
FIG. 3 shows details of a first RF switching circuit illustrated in FIG. 1 according to one embodiment of the first RF switching circuit.

In this regard, during the ON mode, a gate of the first switching transistor element 200 (FIG. 3) is positive with respect to a source of the first switching transistor element 200 (FIG. 3), and during the OFF mode, the gate of the first switching transistor element 200 (FIG. 3) is negative with respect to a source of the first switching transistor element 200 (FIG. 3). By providing negative polarity to the gate of the first switching transistor element 200 (FIG. 3) during the OFF mode, isolation of the first stacked RF switch 102 during the OFF mode may be increased.

In an alternate embodiment of the RF circuitry 100, the second capacitive element C2 is omitted, such that the group of RF switching circuits 150, 152, 154 is directly coupled to the second RF switch connection node SCN.

FIG. 3 shows details of the first RF switching circuit 150 illustrated in FIG. 1 according to one embodiment of the first RF switching circuit 150. The first RF switching circuit 150 includes the first switching transistor element 200, a first S/D bias resistive element 202, the first S/D shorting circuit 204, and a first gate resistive element 206. In one embodiment of the first switching transistor element 200, the first switching transistor element 200 is an N-channel metal-oxide semiconductor (NMOS) transistor element.

The first switching transistor element 200 is coupled between the first source connection node FSN and the first drain connection node FDN, such that a source of the first switching transistor element 200 is coupled to the first source connection node FSN and a drain of the first switching transistor element 200 is coupled to the first drain connection node FDN. The first S/D bias resistive element 202 is coupled across the first switching transistor element 200, and the first S/D shorting circuit 204 is coupled across the first S/D bias resistive element 202. The first gate resistive element 206 is coupled between the first gate input connection node FNN and the first gate output connection node FTN. A gate of the first switching transistor element 200 is coupled to the first gate output connection node FTN.

The first S/D shorting circuit 204 is one of ON and OFF based on the first S/D shorting enable signal FSS. During the ON mode, the first switching transistor element 200 is ON based on the first RF switch enable signal FSE and the first S/D shorting circuit 204 is ON based on the first S/D shorting enable signal FSS. During a first interval immediately following a transition from the ON mode to the OFF mode, the first S/D shorting circuit 204 is ON based on the first S/D shorting enable signal FSS.

In one embodiment of the first RF switching circuit 150, the first switching transistor element 200 is coupled in series between the first RF switch connection node FCN (FIG. 1) and the second RF switch connection node SCN (FIG. 1). In one embodiment of the first stacked RF switch 102 (FIG. 1), during the OFF mode, the first switching transistor element 200 is OFF based on the first RF switch enable signal FSE, and during the OFF mode after the first interval, the first S/D shorting circuit 204 is OFF based on the first S/D shorting enable signal FSS.

In one embodiment of the first stacked RF switch 102 (FIG. 1), each of any or all of the group of RF switching circuits 150, 152, 154 (FIG. 1) has a corresponding switching transistor element (not shown) coupled in series between the first RF switch connection node FCN (FIG. 1) and the second RF switch connection node SCN (FIG. 1), such that each switching transistor element (not shown) is similar to the first switching transistor element 200.

As such, in one embodiment of the first stacked RF switch 102 (FIG. 1), during the ON mode, an ON resistance of the first stacked RF switch 102 (FIG. 1) between the first RF switch connection node FCN (FIG. 1) and the second RF switch connection node SCN (FIG. 1) is based on an ON resistance of each of the switching transistor element (not shown) coupled in series between the first RF switch connection node FCN (FIG. 1) and the second RF switch connection node SCN (FIG. 1). Similarly, during the OFF mode, an OFF resistance of the first stacked RF switch 102 (FIG. 1) between the first RF switch connection node FCN (FIG. 1) and the second RF switch connection node SCN (FIG. 1) is based on an OFF resistance of each of the switching transistor element (not shown) coupled in series between the first RF switch connection node FCN (FIG. 1) and the second RF switch connection node SCN (FIG. 1). The first switching transistor element 200 has a gate-to-source voltage VGS between the gate of the first switching transistor element 200 and the source of the first switching transistor element 200.

Figure 4:
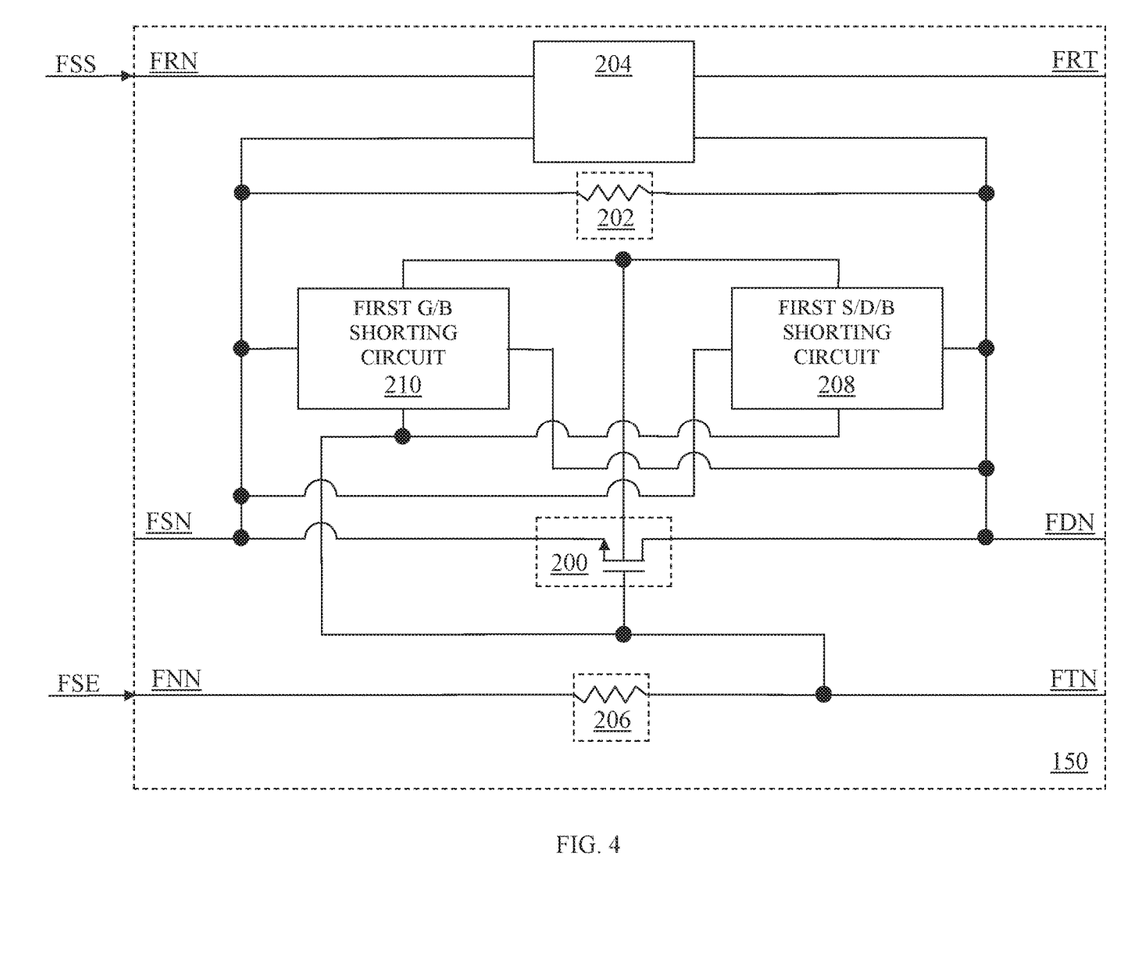
FIG. 4 shows details of the first RF switching circuit illustrated in FIG. 1 according to an alternate embodiment of the first RF switching circuit.

FIG. 4 shows details of the first RF switching circuit 150 illustrated in FIG. 1 according to an alternate embodiment of the first RF switching circuit 150. The first RF switching circuit 150 illustrated in FIG. 4 is similar to the first RF switching circuit 150 illustrated in FIG. 3, except in the first RF switching circuit 150 illustrated in FIG. 4, the first switching transistor element 200 is a body-contacted transistor element. As such, in one embodiment of the first RF switching circuit 150, the first RF switching circuit 150 further includes a first source/drain/body (S/D/B) shorting circuit 208, a first gate/body (G/B) shorting circuit 210, or both. By using the first S/D/B shorting circuit 208, a need for a source/drain body bias resistor string may be eliminated. By using the first G/B shorting circuit 210, a need for a gate body bias resistor string maybe eliminated.

In one embodiment of the first stacked RF switch 102 (FIG. 1), each of any or all of the group of RF switching circuits 150, 152, 154 (FIG. 1) has a corresponding S/D/B shorting circuit, a corresponding G/B circuit, or both. The first S/D/B shorting circuit 208 is coupled between a body of the first switching transistor element 200 and a source of the first switching transistor element 200, and the first S/D/B shorting circuit 208 is further coupled between the body of the first switching transistor element 200 and a drain of the first switching transistor element 200. Additionally, the first S/D/B shorting circuit 208 is controlled by the first RF switch enable signal FSE.

As such, the first S/D/B shorting circuit 208 provides a switching function between the body and the source of the first switching transistor element 200, and further provides a switching function between the body and the drain of the first switching transistor element 200 based on the first RF switch enable signal FSE.

The first G/B shorting circuit 210 is coupled between the body of the first switching transistor element 200 and the gate of the first switching transistor element 200. Additionally, the first G/B shorting circuit 210 is controlled by the source and the drain of the first switching transistor element 200. As such, the first G/B shorting circuit 210 provides a switching function between the body of the first switching transistor element 200 and the gate of the first switching transistor element 200 based on the source and the drain of the first switching transistor element 200.

Figure 5:
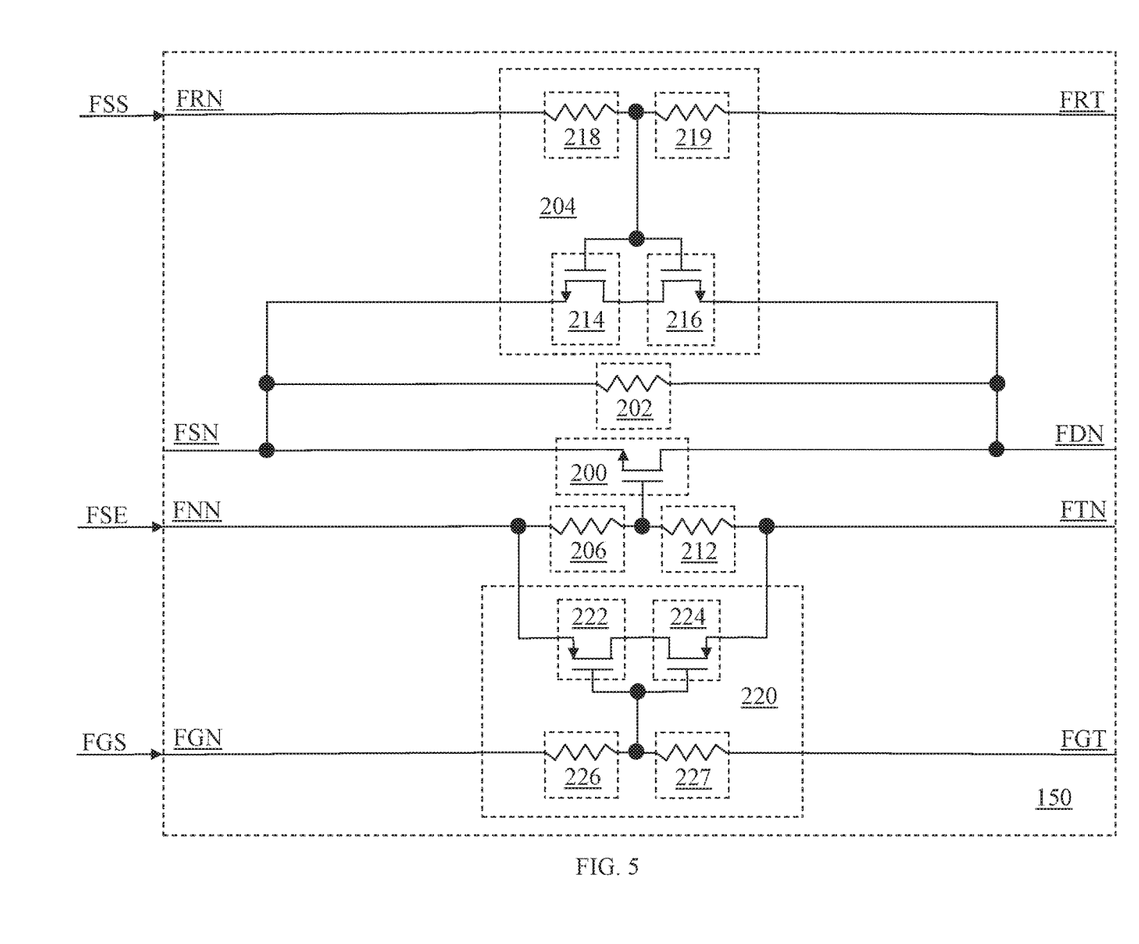
FIG. 5 shows details of the first RF switching circuit illustrated in FIG. 1 according to an additional embodiment of the first RF switching circuit.

FIG. 5 shows details of the first RF switching circuit 150 illustrated in FIG. 1 according to an additional embodiment of the first RF switching circuit 150. The first RF switching circuit 150 illustrated in FIG. 5 is similar to the first RF switching circuit 150 illustrated in FIG. 3, except in the first RF switching circuit 150 illustrated in FIG. 5, the first RF switching circuit 150 further includes a first supplemental gate resistive element 212.

The first S/D shorting circuit 204 includes a first S/D shorting transistor element 214, a first supplemental S/D shorting transistor element 216, a first S/D shorting resistive element 218, and a second S/D shorting resistive element 219. The first S/D shorting transistor element 214 and the first supplemental S/D shorting transistor element 216 are coupled in series to form a series combination, which is coupled across the first S/D bias resistive element 202. The first S/D shorting resistive element 218 is coupled between the first S/D shorting connection node FRN and gates of the first S/D shorting transistor element 214 and the first supplemental S/D shorting transistor element 216. The second S/D shorting resistive element 219 is coupled between the first S/D output shorting connection node FRT and the gates of the first S/D shorting transistor element 214 and the first supplemental S/D shorting transistor element 216.

The first gate resistive element 206 is coupled between the first gate input connection node FNN and the gate of the first switching transistor element 200. The first supplemental gate resistive element 212 is coupled between the first gate output connection node FTN and the gate of the first switching transistor element 200.

The first RF switching circuit 150 additionally includes a first gate shorting circuit 220 coupled between the first gate input connection node FNN and the first gate output connection node FTN. During the ON mode, the first switching transistor element 200 and the first gate shorting circuit 220 are ON. During a first interval immediately following a transition from the ON mode to the OFF mode, the first gate shorting circuit 220 is ON. During the OFF mode, the first switching transistor element 200 is OFF; and during the OFF mode after the first interval, the first gate shorting circuit 220 is OFF.

The first gate shorting circuit 220 includes a first gate shorting transistor element 222, a first supplemental gate shorting transistor element 224, a first gate shorting resistive element 226, and a second gate shorting resistive element 227. The first gate shorting transistor element 222 and the first supplemental gate shorting transistor element 224 form a pair of shorting transistor elements 222, 224 coupled in series between the first gate input connection node FNN and the first gate output connection node FTN. In one embodiment of the first gate shorting transistor element 222 and the first supplemental gate shorting transistor element 224, each of the first gate shorting transistor element 222 and the first supplemental gate shorting transistor element 224 is a PMOS transistor element. The first gate shorting resistive element 226 is coupled between the first gate shorting connection node FGN and the gates of the first gate shorting transistor element 222 and first supplemental gate shorting transistor element 224. The second gate shorting resistive element 227 is coupled between the first gate output shorting connection node FGT and the gates of the first gate shorting transistor element 222 and first supplemental gate shorting transistor element 224.

In one embodiment of the first switching transistor element 200, the first S/D shorting transistor element 214 and the first supplemental S/D shorting transistor element 216, each of the first switching transistor element 200, the first S/D shorting transistor element 214 and the first supplemental S/D shorting transistor element 216 is an NMOS transistor element. When the first S/D shorting circuit 204 is ON, each of the first S/D shorting transistor element 214 and the first supplemental S/D shorting transistor element 216 is ON. Conversely, when the first S/D shorting circuit 204 is OFF, each of the first S/D shorting transistor element 214 and the first supplemental S/D shorting transistor element 216 is OFF.

Figure 6:
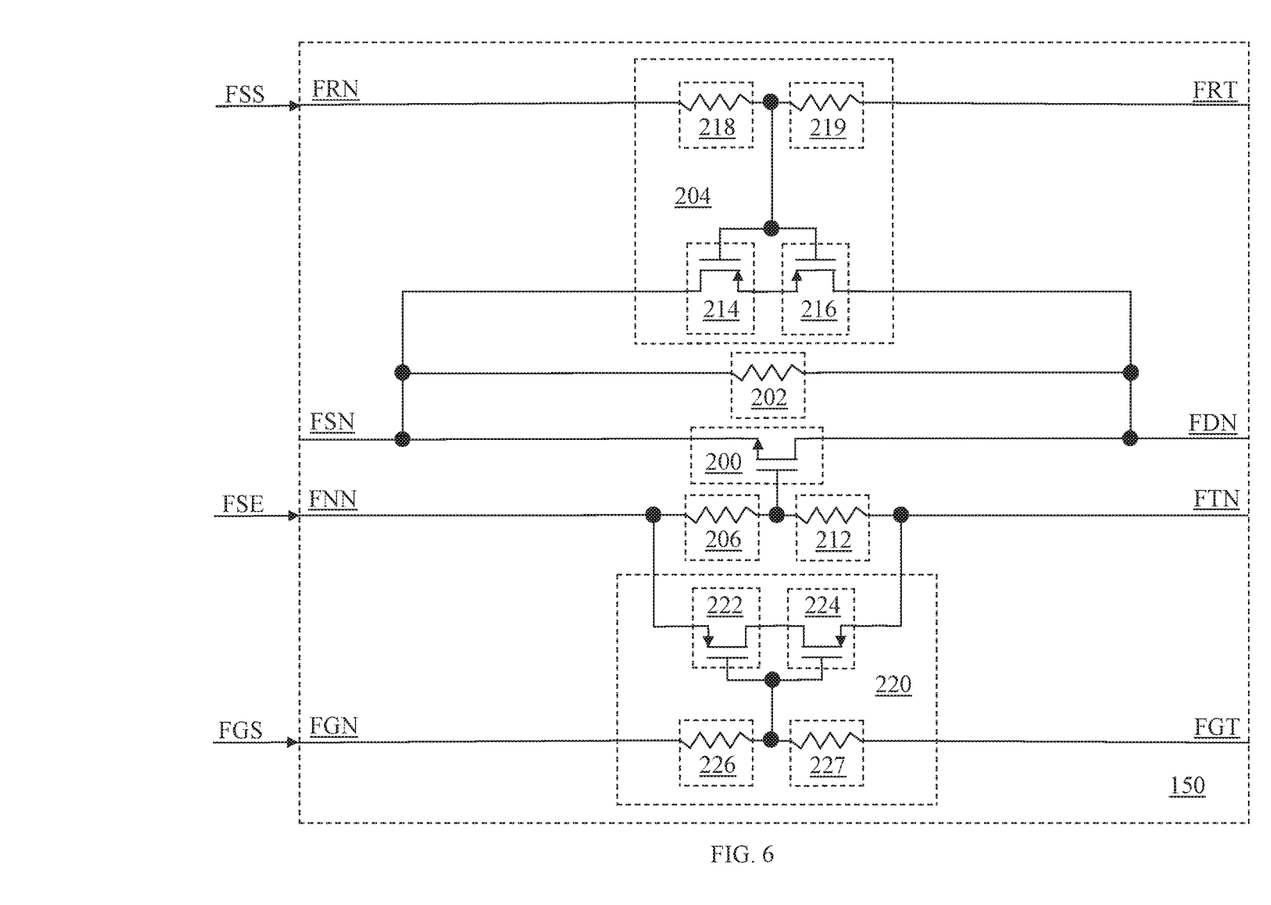
FIG. 6 shows details of the first RF switching circuit illustrated in FIG. 1 according to another embodiment of the first RF switching circuit.

FIG. 6 shows details of the first RF switching circuit 150 illustrated in FIG. 1 according to another embodiment of the first RF switching circuit 150. The first RF switching circuit 150 illustrated in FIG. 6 is similar to the first RF switching circuit 150 illustrated in FIG. 5, except in the first RF switching circuit 150 illustrated in FIG. 6, each of the first S/D shorting transistor element 214 and the first supplemental S/D shorting transistor element 216 is a PMOS transistor element.

Figure 7:
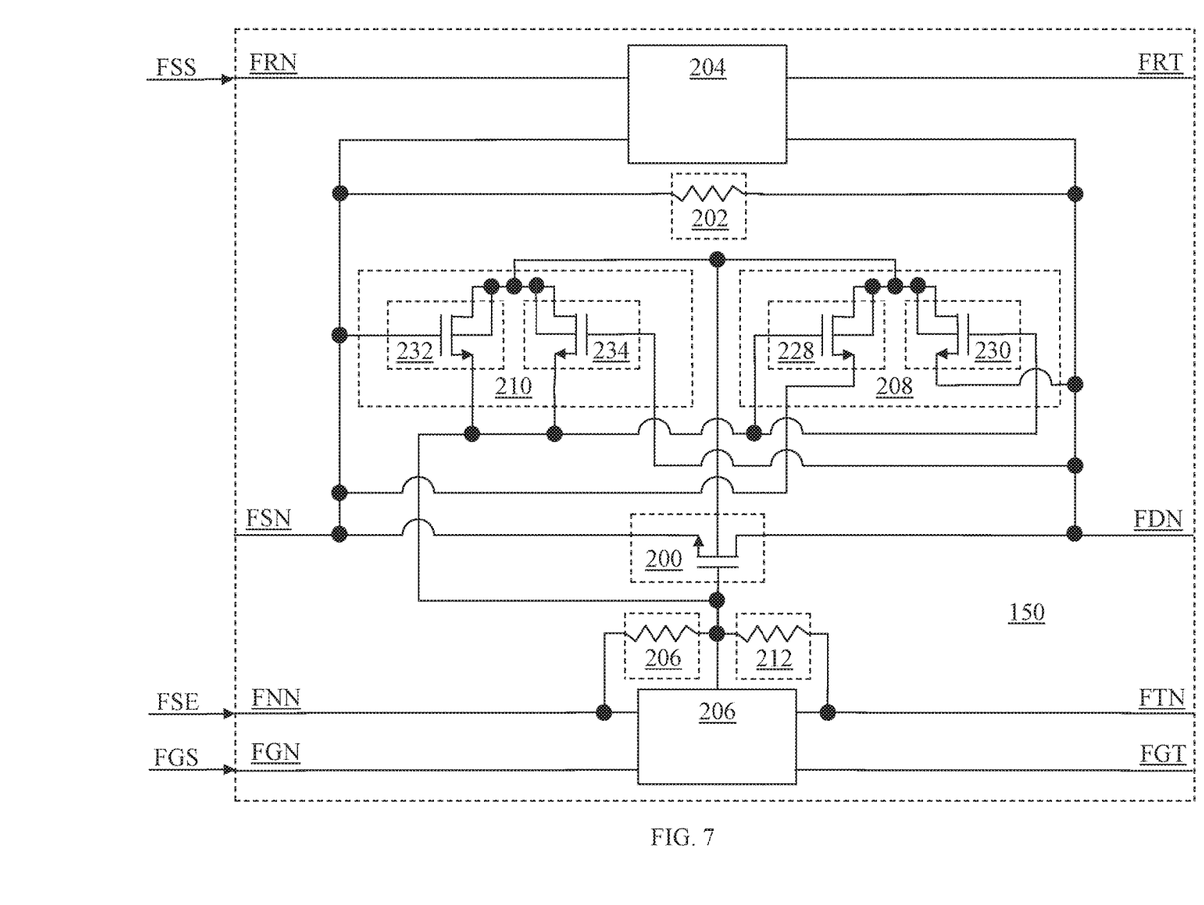
FIG. 7 shows details of the first RF switching circuit illustrated in FIG. 1 according to a further embodiment of the first RF switching circuit.
Figure 8A:
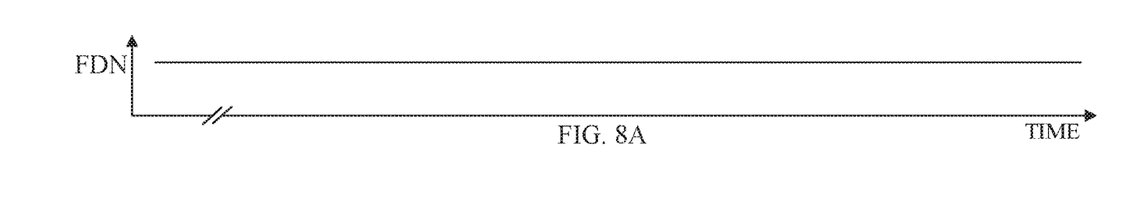
FIGS. 8A, 8B, 8C, and 8D are graphs illustrating a first DC bias signal shown in FIG. 2, a first RF switch enable signal shown in FIG. 3, a first S/D shorting enable signal shown in FIG. 3, and a gate-to-source voltage shown in FIG. 3, respectively.
Figure 8B:
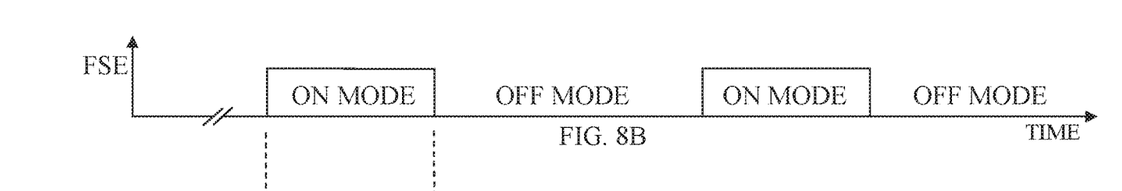
Figure 8C:
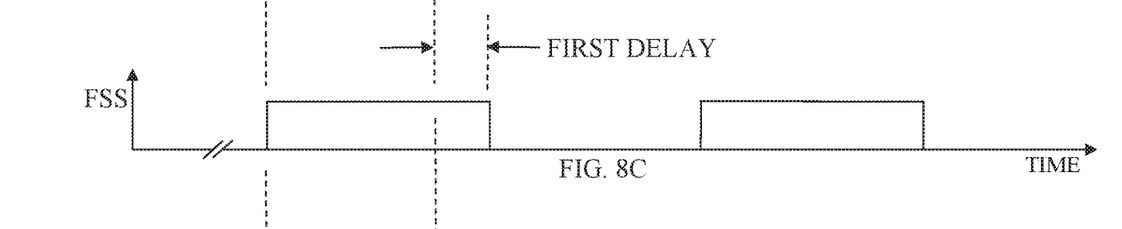
Figure 8D:
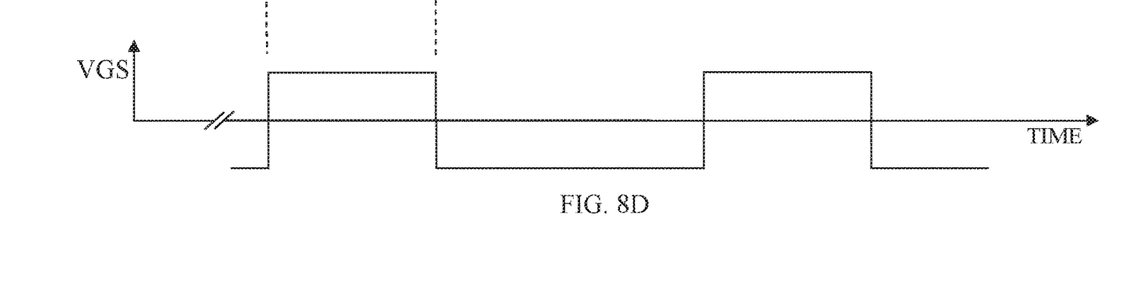

FIG. 7 shows details of the first RF switching circuit 150 illustrated in FIG. 1 according to a further embodiment of the first RF switching circuit 150. The first S/D/B shorting circuit 208 includes a first S/D/B shorting transistor element 228 and a second S/D/B shorting transistor element 230. The first S/D/B shorting transistor element 228 is coupled between the body of the first switching transistor element 200 and the source of the first switching transistor element 200. The second S/D/B shorting transistor element 230 is coupled between the body of the first switching transistor element 200 and the drain of the first switching transistor element 200. A gate of the first S/D/B shorting transistor element 228 is coupled to the gate of the first switching transistor element 200. A gate of the second S/D/B shorting transistor element 230 is coupled to the gate of the first switching transistor element 200.

The first G/B shorting circuit 210 includes a first G/B shorting transistor element 232 and a second G/B shorting transistor element 234. The first G/B shorting transistor element 232 is coupled between the body of the first switching transistor element 200 and the gate of the first switching transistor element 200. The second G/B shorting transistor element 234 is coupled between the body of the first switching transistor element 200 and the gate of the first switching transistor element 200. A gate of first G/B shorting transistor element 232 is coupled to the source of the first switching transistor element 200. A gate of the second G/B shorting transistor element 234 is coupled to the drain of the first switching transistor element 200.

FIGS. 8A, 8B, 8C, and 8D are graphs illustrating the first DC bias signal FDS shown in FIG. 2, the first RF switch enable signal FSE shown in FIG. 3, the first S/D shorting enable signal FSS shown in FIG. 3, and the gate-to-source voltage VGS shown in FIG. 3, respectively. The first DC bias signal FDS establishes a bias point at the source of the first switching transistor element 200 (FIG. 3) via the first source connection node FSN (FIG. 3). The first RF switch enable signal FSE (FIG. 3) selects either the ON mode or the OFF mode via the first gate input connection node FNN. The first S/D shorting enable signal FSS enables and disables the first S/D shorting circuit 204 (FIG. 3). In this regard, the first S/D shorting circuit 204 (FIG. 3) is enabled during the ON mode and during the first interval after the transition from the ON mode to the OFF mode. The first DC bias signal FDS provides a DC bias that allows the gate-to-source voltage VGS (FIG. 3) to swing both positive and negative, thereby increasing isolation of the first switching transistor element 200 (FIG. 3) during the OFF mode.

Figure 9:
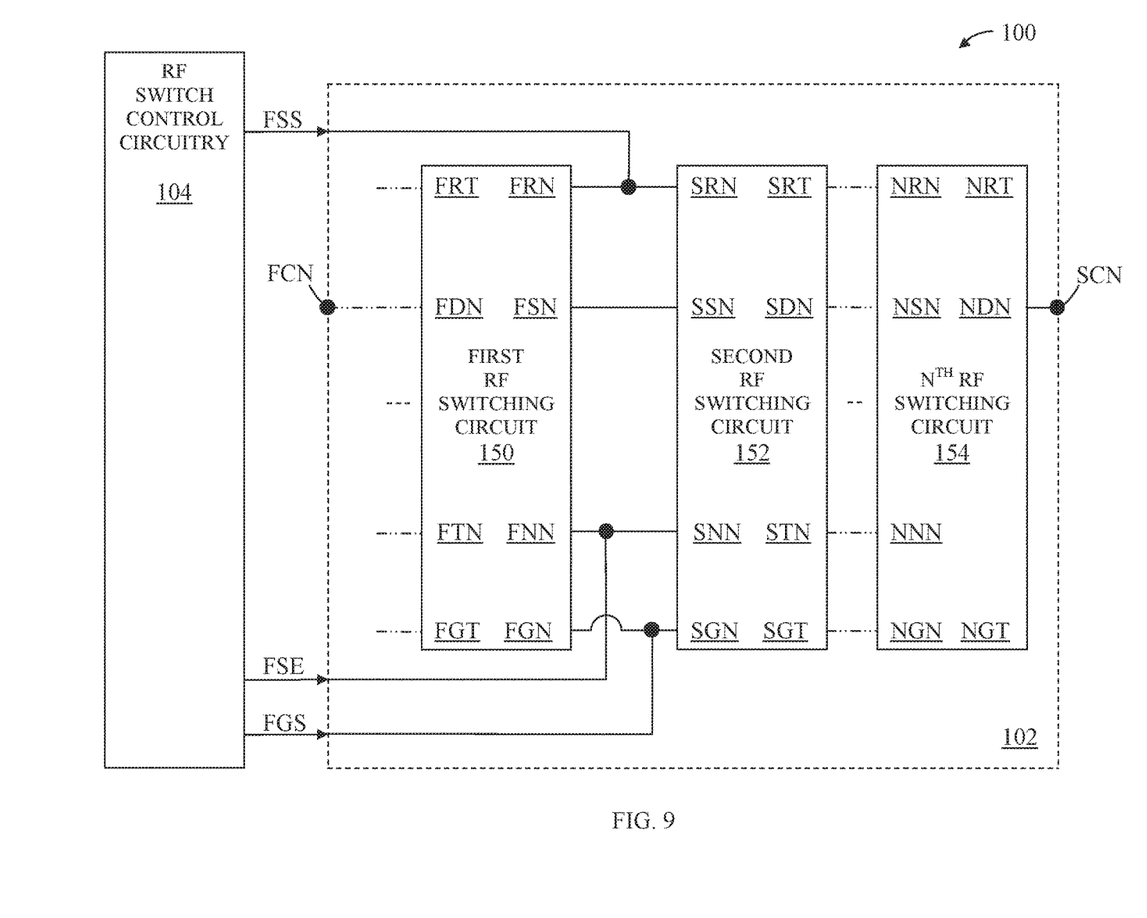
FIG. 9 shows the RF circuitry according to one embodiment of the RF circuitry.

FIG. 9 shows the RF circuitry 100 according to one embodiment of the RF circuitry 100. The RF circuitry 100 illustrated in FIG. 9 is similar to the RF circuitry 100 illustrated in FIG. 1, except in the RF circuitry 100 illustrated in FIG. 9, instead of the first source connection node FSN being coupled to the first RF switch connection node FCN and the N$^{TH}$ drain connection node NDN being coupled to the second RF switch connection node SCN as illustrated in FIG. 1, the first source connection node FSN is coupled to the second source connection node SSN, the first gate input connection node FNN is coupled to the second gate input connection node SNN, the first S/D input shorting connection node FRN is coupled to the second S/D input shorting connection node SRN, and the first gate shorting connection node FGN is coupled to the second gate input shorting connection node SGN.

In one embodiment of the RF circuitry 100, the first source connection node FSN is directly coupled to the second source connection node SSN, the first gate input connection node FNN is directly coupled to the second gate input connection node SNN, the first S/D input shorting connection node FRN is directly coupled to the second S/D input shorting connection node SRN, and the first gate shorting connection node FGN is directly coupled to the second gate input shorting connection node SGN.

In the RF circuitry 100 illustrated in FIG. 1, the RF switch control circuitry 104 provides the first S/D shorting enable signal FSS, the first RF switch enable signal FSE, and the first gate shorting enable signal FGS at one end of the group of RF switching circuits 150, 152, 154. However, in the RF circuitry 100 illustrated in FIG. 9, the RF switch control circuitry 104 provides the first S/D shorting enable signal FSS, the first RF switch enable signal FSE, and the first gate shorting enable signal FGS at an intermediate location of the group of RF switching circuits 150, 152, 154. As a result, the first S/D shorting enable signal FSS, the first RF switch enable signal FSE, and the first gate shorting enable signal FGS simultaneously propagate in two directions, namely from the RF switch control circuitry 104 simultaneously toward both the first RF switch connection node FCN and the second RF switch connection node SCN. Conversely, in the RF circuitry 100 illustrated in FIG. 1, the first S/D shorting enable signal FSS, the first RF switch enable signal FSE, and the first gate shorting enable signal FGS propagate in one direction only, namely from the RF switch control circuitry 104 via the first RF switch connection node FCN toward the second RF switch connection node SCN.

Those skilled in the art will recognize improvements and modifications to the preferred embodiments of the present disclosure. All such improvements and modifications are considered within the scope of the concepts disclosed herein and the claims that follow.

What is claimed is:

1. A first stacked RF switch comprising a plurality of RF switching circuits coupled in series between a first RF switch connection node and a second RF switch connection node, comprising:
   a first RF switching circuit of the plurality of RF switching circuits, comprising:
      a first switching transistor element coupled between a first source connection node and a first drain connection node;
      a first source/drain (S/D) bias resistive element coupled across the first switching transistor element; and
      a first S/D shorting circuit coupled across the first S/D bias resistive element, such that the first switching transistor element is coupled in series between the first RF switch connection node and the second RF switch connection node; and
   a second RF switching circuit of the plurality of RF switching circuits, comprising a second switching transistor element coupled between the first drain connection node and a second drain connection node;
   wherein:
      the first stacked RF switch is configured to operate in one of an ON mode and an OFF mode;
      during the ON mode, the first switching transistor element and the second switching transistor element are configured to be ON and the first S/D shorting circuit is configured to be ON; and
      during a first interval immediately following a transition from the ON mode to the OFF mode, the first S/D shorting circuit is further configured to be ON.

2. The first stacked RF switch of claim 1 wherein the plurality of RF switching circuits is directly coupled between the first RF switch connection node and the second RF switch connection node.

3. The first stacked RF switch of claim 1 further comprising a first capacitive element and a second capacitive element, wherein:
   the first capacitive element is coupled between the plurality of RF switching circuits and the first RF switch connection node; and
   the second capacitive element is coupled between the plurality of RF switching circuits and the second RF switch connection node.

4. The first stacked RF switch of claim 1 further comprising a first capacitive element and a second capacitive element, wherein:
   the first capacitive element is coupled between the first RF switching circuit and ground;
   the second capacitive element is coupled between the plurality of RF switching circuits and the second RF switch connection node; and
   RF switch control circuitry is configured to:
      select the one of the ON mode and the OFF mode;
      provide a first RF switch enable signal to the first RF switching circuit via a first gate input connection node, wherein the first RF switch enable signal is representative of the one of the ON mode and the OFF mode; and provide a first DC bias signal to the first capacitive element, such that during the ON mode, a voltage of the first RF switch enable signal is positive with respect to a voltage of the first DC bias signal, and during the OFF mode, the voltage of the first RF switch enable signal is negative with respect to the voltage of the first DC bias signal.

5. The first stacked RF switch of claim 1 wherein RF switch control circuitry is configured to select the one of the ON mode and the OFF mode and further configured to provide a first RF switch enable signal to the first RF switching circuit via a first gate input connection node, wherein the first RF switch enable signal is representative of the one of the ON mode and the OFF mode.

6. The first stacked RF switch of claim 1 wherein during the OFF mode, the first switching transistor element is further configured to be OFF, and during the OFF mode after the first interval, the first S/D shorting circuit is further configured to be OFF.

7. The first stacked RF switch of claim 1 wherein:
RF switch control circuitry is configured to select the one of the ON mode and the OFF mode;
the RF switch control circuitry is further configured to provide a first S/D shorting enable signal to the first S/D shorting circuit via a first S/D shorting connection node based on the one of the ON mode and the OFF mode; and
the first S/D shorting circuit is further configured to be one of ON and OFF based on the first S/D shorting enable signal.

8. The first stacked RF switch of claim 1 wherein:
during the OFF mode after the first interval, the first S/D shorting circuit is further configured to be OFF;
the first S/D shorting circuit comprises a first S/D shorting transistor element and a first supplemental S/D shorting transistor element coupled in series to form a series combination, which is coupled across the first S/D bias resistive element;
when the first S/D shorting circuit is ON, each of the first S/D shorting transistor element and the first supplemental S/D shorting transistor element is configured to be ON; and
when the first S/D shorting circuit is OFF, each of the first S/D shorting transistor element and the first supplemental S/D shorting transistor element is configured to be OFF.

9. The first stacked RF switch of claim 8 wherein each of the first switching transistor element, the first S/D shorting transistor element, and the first supplemental S/D shorting transistor element is an NMOS transistor element.

10. The first stacked RF switch of claim 8 wherein the first switching transistor element is an NMOS transistor element and each of the first S/D shorting transistor element and the first supplemental S/D shorting transistor element is a PMOS transistor element.

11. The first stacked RF switch of claim 1 wherein the first RF switching circuit further comprises a first source/drain/body (S/D/B) shorting circuit, such that:
the first S/D/B shorting circuit is coupled between a body of the first switching transistor element and a source of the first switching transistor element;
the first S/D/B shorting circuit is further coupled between the body of the first switching transistor element and a drain of the first switching transistor element; and
the first S/D/B shorting circuit is configured to be controlled by a first RF switch enable signal.

12. The first stacked RF switch of claim 11 wherein the first S/D/B shorting circuit comprises a first S/D/B shorting transistor element and a second S/D/B shorting transistor element, such that:
the first S/D/B shorting transistor element is coupled between the body of the first switching transistor element and the source of the first switching transistor element;
the second S/D/B shorting transistor element is coupled between the body of the first switching transistor element and the drain of the first switching transistor element;
a gate of the first S/D/B shorting transistor element is coupled to a gate of the first switching transistor element; and
a gate of the second S/D/B shorting transistor element is coupled to the gate of the first switching transistor element.

13. The first stacked RF switch of claim 1 wherein the first RF switching circuit further comprises a first gate/body (G/B) shorting circuit, such that:
the first G/B shorting circuit is coupled between a body of the first switching transistor element and a gate of the first switching transistor element; and
the first G/B shorting circuit is configured to be controlled by a source and a drain of the first switching transistor element.

14. The first stacked RF switch of claim 13 wherein the first G/B shorting circuit comprises a first G/B shorting transistor element and a second G/B shorting transistor element, such that:
the first G/B shorting transistor element is coupled between the body of the first switching transistor element and the gate of the first switching transistor element;
the second G/B shorting transistor element is coupled between the body of the first switching transistor element and the gate of the first switching transistor element;
a gate of first G/B shorting transistor element is coupled to the source of the first switching transistor element; and
a gate of the second G/B shorting transistor element is coupled to the drain of the first switching transistor element.

15. The first stacked RF switch of claim 1 wherein:
the first RF switching circuit further comprises a first gate resistive element coupled between a first gate input connection node and a gate of the first switching transistor element, a first supplemental gate resistive element coupled between a first gate output connection node and the gate of the first switching transistor element, and a first gate shorting circuit coupled between the first gate input connection node and the first gate output connection node;
during the ON mode, the first gate shorting circuit is configured to be ON; and
during a second interval immediately following the transition from the ON mode to the OFF mode, the first gate shorting circuit is further configured to be ON.

16. The first stacked RF switch of claim 15 wherein during the OFF mode, the first switching transistor element is further configured to be OFF; during the OFF mode after the first interval, the first S/D shorting circuit is further configured to be OFF; and during the OFF mode after the second interval, the first gate shorting circuit is further configured to be OFF.

17. The first stacked RF switch of claim 1 wherein during a transition from the OFF mode to the ON mode, the first switching transistor element is further configured to transition from OFF to ON and the first S/D shorting circuit is further configured to transition from OFF to ON.

18. A first stacked RF switch comprising a plurality of RF switching circuits coupled in series between a first RF switch connection node and a second RF switch connection node via a first source connection node and a second source connection node, wherein the first source connection node is directly coupled to the second source connection node, comprising:

a first RF switching circuit of the plurality of RF switching circuits having the first source connection node and comprising:

a first switching transistor element coupled between the first source connection node and a first drain connection node;

a first source/drain (S/D) bias resistive element coupled across the first switching transistor element; and         a first S/D shorting circuit coupled across the first S/D bias resistive element, such that the first switching transistor element is coupled in series between the first RF switch connection node and the second RF switch connection node; and     a second RF switching circuit of the plurality of RF switching circuits, having the second source connection node and comprising a second switching transistor element coupled between the second source connection node and a second drain connection node;

wherein:

the first stacked RF switch is configured to operate in one of an ON mode and an OFF mode;

during the ON mode, the first switching transistor element and the second switching transistor element are configured to be ON and the first S/D shorting circuit is configured to be ON; and     during a first interval immediately following a transition from the ON mode to the OFF mode, the first S/D shorting circuit is further configured to be ON.

\* \* \* \* \*